United States Patent
Tanaka et al.

(10) Patent No.: US 9,610,771 B2
(45) Date of Patent: Apr. 4, 2017

(54) LIQUID DISCHARGE APPARATUS AND METHOD FOR PRODUCING THE SAME

(71) Applicant: Brother Kogyo Kabushiki Kaisha, Nagoya-shi, Aichi-ken (JP)

(72) Inventors: Taiki Tanaka, Yokkaichi (JP); Katsumi Kakamu, Kuwana (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 0 days.

(21) Appl. No.: 14/975,963

(22) Filed: Dec. 21, 2015

(65) Prior Publication Data

US 2016/0185117 A1   Jun. 30, 2016

(30) Foreign Application Priority Data

Dec. 26, 2014 (JP) ................. 2014-264175

(51) Int. Cl.
*B41J 2/14* (2006.01)
*B41J 2/16* (2006.01)

(52) U.S. Cl.
CPC ........... *B41J 2/14233* (2013.01); *B41J 2/161* (2013.01); *B41J 2/1623* (2013.01); *B41J 2/1628* (2013.01); *B41J 2/1629* (2013.01); *B41J 2/1643* (2013.01); *B41J 2/1646* (2013.01); *B41J 2002/14491* (2013.01); *B41J 2202/18* (2013.01)

(58) Field of Classification Search
CPC  B41J 2/14201; B41J 2/14233; B41J 2/14072; B41J 2002/14491; B41J 2202/18
See application file for complete search history.

(56) References Cited

U.S. PATENT DOCUMENTS 6,158,847 A * 12/2000 Usui .................... B41J 2/14233
                                                347/70
2012/0212547 A1* 8/2012 Takemoto ................ B41J 2/055
                                                347/70

FOREIGN PATENT DOCUMENTS

| JP | 2000-006398 A | 1/2000 |
| JP | 4811598 B2 | 11/2011 |
| JP | 2013-111819 A | 6/2013 |

* cited by examiner

*Primary Examiner* — Geoffrey Mruk
(74) *Attorney, Agent, or Firm* — Banner & Witcoff, Ltd.

(57) ABSTRACT

A liquid discharge apparatus includes: a pressure chamber; a film covering the pressure chamber; a piezoelectric element disposed on the film and including a piezoelectric part, a first electrode, and a second electrode, wherein the first electrode is disposed on a first side of the piezoelectric part facing the pressure chamber, and the second electrode is disposed on a second side of the piezoelectric part opposite the first side; a gold trace connected to the first electrode or the second electrode; and a first metal part made of a metal material except for gold and positioned between the film and the gold trace. The first metal part is laminated with the gold trace.

16 Claims, 13 Drawing Sheets

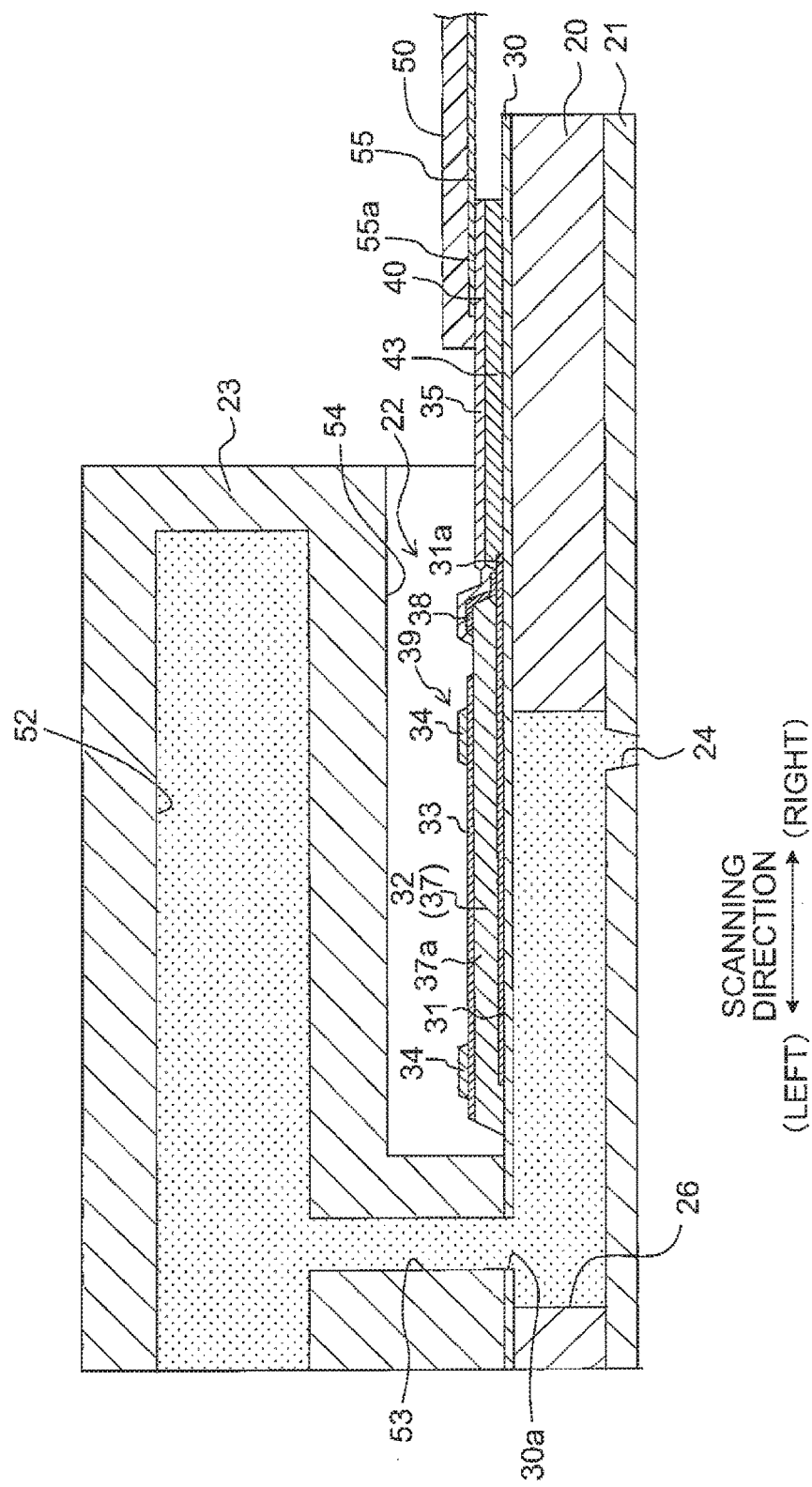

LIQUID DISCHARGE APPARATUS AND METHOD FOR PRODUCING THE SAME

CROSS REFERENCE TO RELATED APPLICATION

The present application claims priority from Japanese Patent Application No. 2014-264175 filed on Dec. 26, 2014, the disclosure of which is incorporated herein by reference in its entirety.

BACKGROUND OF THE INVENTION

Field of the Invention

The present invention relates to a liquid discharge apparatus configured to discharge liquid and a method for producing the liquid discharge apparatus.

Description of the Related Art

As a liquid discharge apparatus, Japanese Patent Application Laid-open No. 2013-111819 discloses an ink-jet head including piezoelectric elements for discharging liquid. The ink-jet head is provided with a channel forming substrate which includes pressure chambers, and piezoelectric elements provided on the channel forming substrate to correspond to the pressure chambers respectively. Each of the piezoelectric elements includes a piezoelectric film, a lower electrode film disposed on the lower side of the piezoelectric film, and an upper electrode film disposed on the upper side of the piezoelectric film. The lower electrode film is an individual electrode individually provided for each piezoelectric element. Upper electrode films of the piezoelectric elements are electrically connected with each other and function as a common electrode for the piezoelectric elements. A Wire (lead electrode) made of gold is connected to the lower electrode film of each of the piezoelectric elements.

SUMMARY

In each of the piezoelectric elements of the ink-jet head described in Japanese Patent Application Laid-open No. 2013-111819, it is preferred that the wire have a large thickness to improve the reliability of electrical connection of the wire connected to the lower electrode film and to reduce the electrical resistance of the wire. However, in the ink-jet head described in Japanese Patent Application Laid-open No. 2013-111819, the wire connected to each lower electrode film is made of gold which is expensive noble metal. Thus, increasing the thickness of each wire requires a larger amount of gold, thereby increasing manufacturing costs.

An object of the present teaching is to improve reliability of electrical connection of each wire and to reduce electrical resistance of each wire white avoiding manufacturing cost increase.

According to a first aspect of the present teaching, there is provided a liquid discharge apparatus, including: a pressure chamber; a film covering the pressure chamber; a piezoelectric element disposed on the film and including a piezoelectric part, a first electrode, and a second electrode, wherein the first electrode is disposed on a first side of the piezoelectric part facing the pressure chamber, and the second electrode is disposed on a second side of the piezoelectric part opposite the first side; a gold trace connected to the first electrode or the second electrode; and a first metal part made of a metal material except for gold and positioned between the film and the gold trace, wherein the first metal part is laminated with the gold trace.

In the present teaching, the gold trace connected to the first electrode or the second electrode is stacked on the first metal part made of a metal material other than gold. Stacking the gold trace on the first metal part increases the substantial thickness of the trace, thereby preventing disconnection of the trace and the like. Further, stacking the gold trace on the first metal part produces the effect of lowering the substantial electrical resistance of the trace. The first metal part is made of a metal material other than gold, i.e., can be made of inexpensive metal material. This improves the reliability of electrical connection of the trace and lowers the electrical resistance of the trace while reducing material costs.

The first metal part is made of a metal material except for gold, which is very stable material. Thus, the stability (for example, corrosion resistance) of the first metal part is lower than that of the gold trace. To solve this problem, it is preferred that the gold trace made of stable Au is disposed on the upper side and the first metal part is disposed on the lower side of the gold trace. In a case that the trace is made of gold, a thin base layer, called an adhesion layer or seed layer, is typically provided on the lower side of a gold layer to improve adhesiveness or to form the gold trace through film formation, plating, or the like. Namely, the concept of "gold trace" according to the present teaching includes not only the gold layer but also the base layer. Accordingly, the liquid discharge apparatus of the present teaching includes not only the gold trace but also the first metal part, the gold trace provided with the gold layer and the base layer disposed on the lower side of the gold layer, the first metal part made of a metal material other than gold.

According to a second aspect of the present teaching, there is provided a method for producing a liquid discharge apparatus, including: forming a first electrode on a film formed on a substrate; forming a piezoelectric part on the first electrode; forming a second electrode on the piezoelectric part; forming a metal part on the film by a metal material except for gold; and forming a gold trace on the metal part to connect to the first electrode.

BRIEF DESCRIPTION OF THE DRAWINGS

FIG. 4 is a cross-sectional view taken along the line IV-IV in FIG. 3.

FIGS. 5A to 5C depict manufacturing steps of the ink-jet head, wherein FIG. 5A depicts a step of forming a vibration film, FIG. 5B depicts a step of forming a lower electrode, and FIG. 5C depicts a step of forming a piezoelectric body.

FIGS. 6A to 6D depict manufacturing steps of the ink-jet head, wherein FIG. 6A depicts a step of forming a conductive film for an upper electrode, FIG. 6B depicts a step of etching of the upper electrode, FIG. 6C depicts a step of forming a metal part, and FIG. 6D depicts a step of forming a wire.

FIGS. 7A to 7C depict manufacturing steps of the ink-jet head, wherein FIG. 7A depicts a step of etching a channel substrate, FIG. 7B depicts a step of joining a nozzle plate, and FIG. 7C depicts a step of joining a reservoir forming member.

DESCRIPTION OF THE EMBODIMENTS

Figure 1:
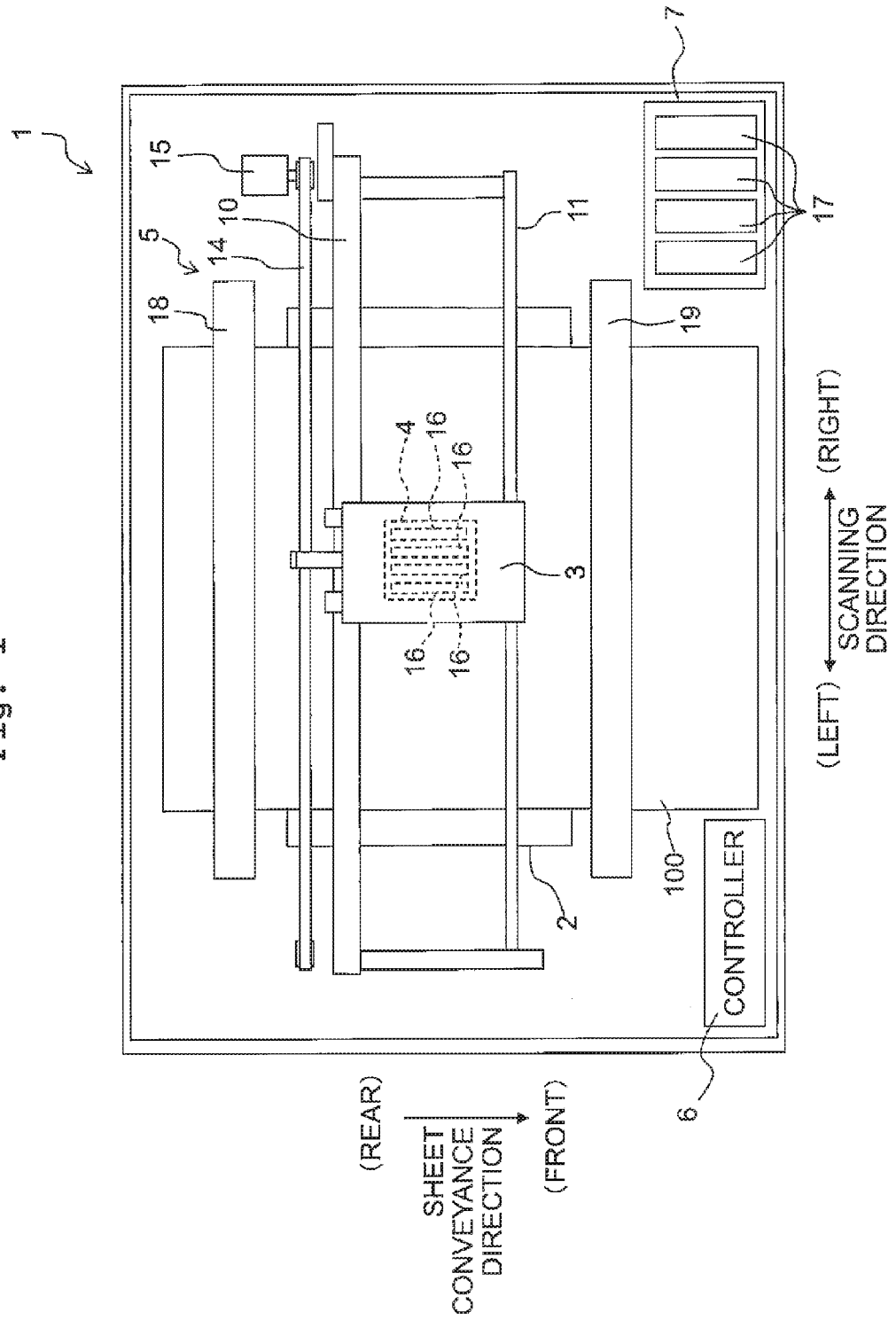
FIG. 1 is a schematic plan view of a printer according to an embodiment of the present teaching.

An explanation will be made about an embodiment of the present teaching. The schematic configuration of an ink-jet printer 1 will be explained first with reference to FIG. 1. The front, rear, left, and right directions depicted in FIG. 1 are defined as "front", "rear", "left", and, "right" of the ink-jet printer 1, respectively. Further, the front side with respect to the paper surface of FIG. 1 is defined as "up" and the back side with respect to the paper surface is defined as "down". In the following, the explanation will be made by appropriately using the front (side), the rear (side), the left (side), the right (side), the up (side), and the down (side) defined as described above.

<Schematic Configuration of Printer>

As depicted in FIG. 1, the ink-jet printer 1 includes a platen 2, a carriage 3, an ink-jet head 4, a conveyance mechanism 5, a controller 6, and the like.

A recording sheet 100 as a recording medium is placed on the upper surface of the platen 2. The carriage 3 is configured to reciprocate in an area facing the platen 2 along two guide rails 10, 11 in a left-right direction (also to be referred to as "scanning direction"). An endless belt 14 is connected to the carriage 3. Driving the endless belt 14 by a carriage drive motor 15 moves the carriage 3 in the scanning direction.

The ink-jet head 4 is installed or mounted to the carriage 3 to move together with the carriage 3 in the scanning direction. The ink-jet head 4 includes four head units 16 arranged in the scanning direction. The four head units 16 are connected to a cartridge holder 7, to which ink cartridges 17 of four colors (black, yellow, cyan, and magenta) are mounted, via unillustrated tubes. Each of the head units 16 includes nozzles 24 (see FIGS. 2 to 4) formed in the lower surface thereof (the back side with respect to the paper surface of FIG. 1). The inks supplied from the ink cartridges 17 are discharged to the recording sheet 100 placed on the platen 2 from the nozzles 24 of the head units 16.

The conveyance mechanism 5 includes two conveyance rollers 18, 19 disposed to interpose the platen 2 in the front-rear direction. The conveyance mechanism 5 conveys the recording sheet 100 placed on the platen 2 forward (to be also referred to as "sheet conveyance direction") by means of the two conveyance rollers 18, 19.

The controller 6 includes a Read Only Memory (ROM), a Random Access Memory (RAM), an Application Specific Integrated Circuit (ASIC) including various control circuits, and the like. The controller 6 controls the ASIC to perform various processes, such as printing on the recording sheet 100, in accordance with programs stored in the ROM. For example, in a case of the printing process, the controller 6 controls the ink-jet head 4, the carriage drive motor 15, and the like to perform the printing of an image or the like on the recording sheet 100 on the basis of a printing command inputted from an external device such as a personal computer. Specifically, the controller 6 alternately performs ink discharge operation and sheet conveyance operation. In the ink discharge operation, the ink is discharged while the ink-jet head 4 and the carriage 3 are being moved in the scanning direction. In the sheet conveyance operation, the recording sheet 100 is conveyed by the conveyance rollers 18, 19 in the sheet conveyance direction by a predetermined amount.

<Details of Ink-jet Head>

Subsequently, an explanation will be made about the detail configuration of the ink-jet head 4. Since the four head units 16 of the ink-jet head 4 have the same configuration, one of the head units 16 will be explained and any explanation of the other three head units 16 will be omitted.

Figure 2:
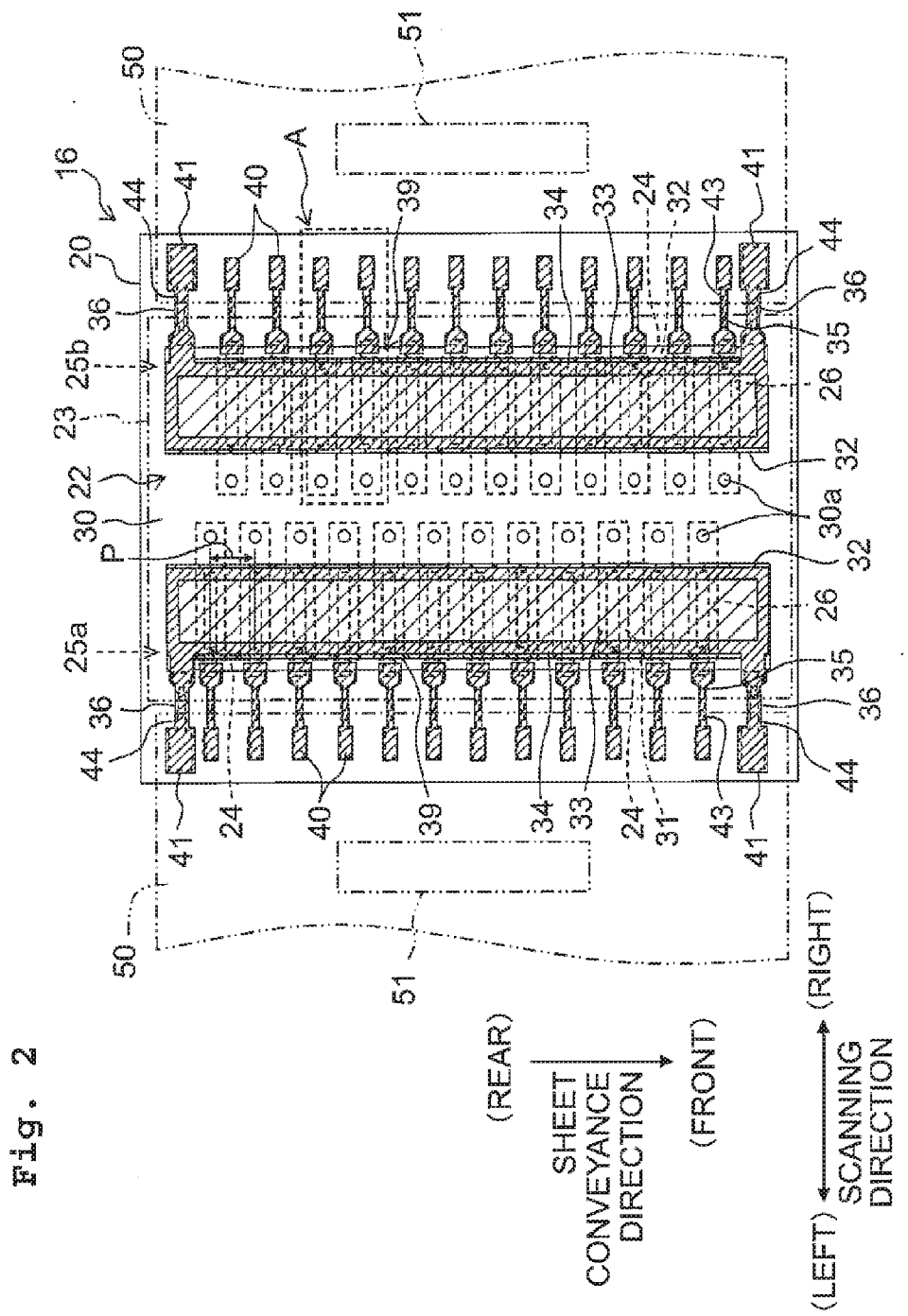
FIG. 2 is a top view of a head unit of an ink-jet head.
Figure 3:
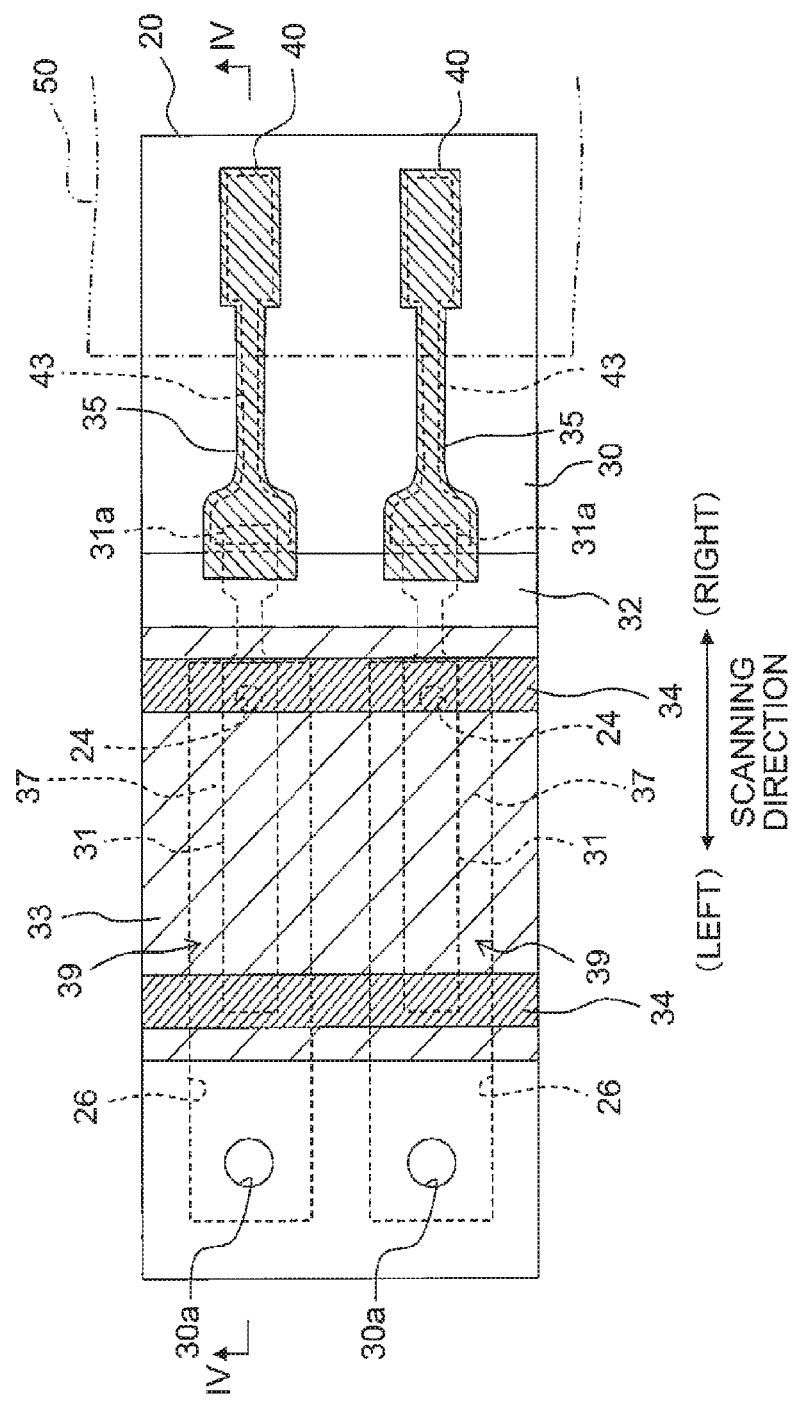
FIG. 3 is an enlarged view of the portion A in FIG. 2.

As depicted in FIGS. 2 to 4, the head unit 16 includes a channel substrate 20, a nozzle plate 21, a piezoelectric actuator 22, and a reservoir forming member 23. In FIG. 2, for the purpose of a simple illustration, the reservoir forming member 23 disposed above the channel substrate 20 and the piezoelectric actuator 22 is depicted by two-dot chain lines to show its external form. Further, a COF 50 clearly depicted in FIG. 4 is depicted by two-dot chain lines in FIGS. 2 and 3.

<Channel Substrate>

The channel substrate 20 is a single crystal silicon substrate. The channel substrate 20 includes pressure chambers 26. As depicted in FIGS. 2 and 3, each of the pressure chambers 26 has a rectangular planar shape elongated in the scanning direction. The pressure chambers 26 are arranged in the sheet conveyance direction to form two pressure chamber rows disposed in the scanning direction. The channel substrate 20 further includes a vibration film 30 covering the pressure chambers 26. The vibration film 30 is a film made of silicon dioxide ($SiO_2$) or silicon nitride ($SiN_x$) which is obtained by oxidizing or nitriding a part of the silicon channel substrate 20. The vibration film 30 includes communicating holes 30a through which the channels in the reservoir forming member 23 communicate with the pressure chambers 26 respectively.

<Nozzle Plate>

The nozzle plate 21 is joined to the lower surface of the channel substrate 20. The nozzle plate 21 includes the nozzles 24 communicating with the pressure chambers 26 of the channel substrate 20 respectively. Similar to the pressure chambers 26, the nozzles 24 are arranged in the sheet conveyance direction to form two nozzle rows 25a, 25b disposed in the scanning direction, as depicted in FIG. 2. The nozzles 24 of the nozzle row 25a are arranged to be deviated from the nozzles 24 of the nozzle row 25b in the sheet conveyance direction by a half (P/2) of an arrangement pitch P of each nozzle row 25. The material of the nozzle plate 21 is not especially limited. Various materials including, for example, a metal material such as stainless steel and a synthetic resin material such as silicon or polyimide can be used for nozzle plate 21.

<Piezoelectric Actuator>

The piezoelectric actuator 22 applies discharge energy to the ink in the pressure chambers 26 so as to discharge the ink from the nozzles 24. The piezoelectric actuator 22 is disposed on the upper surface of the vibration film 30 of the channel substrate 20. As depicted in FIGS. 2 to 4, the piezoelectric actuator 22 includes piezoelectric elements 39 which are disposed on the upper surface of the vibration film 30 to correspond to the pressure chambers 26 in two rows.

In the following, the configuration of each piezoelectric element 39 of the piezoelectric actuator 22 and the configuration associated therewith will be explained in that order. Each piezoelectric element 39 includes a lower electrode 31, a piezoelectric part 37, and an upper electrode 33.

The lower electrode 31, which is provided for each piezoelectric element 39, is disposed in an area overlapping with the piezoelectric chamber 26 on the upper surface of the vibration film 30. Namely, the lower electrode 31 is an individual electrode which is individually provided for each piezoelectric element 39. The lower electrode 31 is made of platinum (Pt). The shape of each lower electrode 31 is not especially limited. For example, FIG. 3 depicts the lower electrodes 31, each of which has a rectangular planar shape smaller than the pressure chamber 26 corresponding thereto. The lower electrode 31 includes a connection part 31a at one end in its longitudinal direction as viewed from above. Each connection part 31a is connected to a trace 35 which will be described later. The connection part 31a extends toward the side opposite to the communicating hole 30a with respect to the pressure chamber 26 corresponding thereto.

As depicted in FIG. 2, two piezoelectric bodies 32, which correspond to two pressure chamber rows respectively, are provided on the upper surface of the vibration film 30. Each piezoelectric body 32 has a rectangular planer shape elongated in the sheet conveyance direction. The parts, of each piezoelectric body 32, facing the piezoelectric chambers 26 are driving parts which apply pressure to the pressure chambers 26. The driving parts are particularly referred to as "piezoelectric parts 37". In other words, connecting the piezoelectric parts 37 of the piezoelectric elements 39 arranged in the sheet conveyance direction to each other constitutes one piezoelectric body 32. Each piezoelectric body 32 is stacked on the lower electrodes 31, which correspond to a row of the pressure chambers 26, to extend across the lower electrodes 31 in the sheet conveyance direction. Namely, the lower electrodes 31 are disposed on the lower side (the vibration plate side) of the piezoelectric parts 37 forming the piezoelectric body 32. Each of the connection parts 31a provided at the one end of the lower electrode 31 in its longitudinal direction extends, in the scanning direction, slightly beyond the piezoelectric body 32 (piezoelectric part 37). Each of the connection parts 31a extending slightly beyond the piezoelectric body 32 is connected to the trace 35.

As depicted in FIG. 4, the left side surface and right side surface of the piezoelectric body 32 are inclined inward to a plane perpendicular to the vibration film 30. The piezoelectric body 32 has a tapered cross-sectional shape in which the upper surface is smaller than the lower surface. The piezoelectric body 32 is made of, for example, a piezoelectric material composed primarily of lead zirconate titanate (PZT) which is a mixed crystal of lead titanate and lead zirconate. Or, the piezoelectric body 32 may be made of a lead-free piezoelectric material containing no lead.

The upper electrode 33 is formed on the upper surface of each piezoelectric body 32. The upper electrode 33 extends in the sheet conveyance direction across the lower electrodes 31 of the piezoelectric elements 39 while sandwiching the piezoelectric body 32 between the upper electrode 33 and the lower electrodes 31. Namely, the upper electrode 33, which faces, in common, the lower electrodes 31 arranged in the sheet conveyance direction, is a common electrode for the piezoelectric elements 39. In other words, the electrode portions, of the upper electrode 33, which face the lower electrodes 31 respectively, are formed integrally to electrically connect to each other. The upper electrode 33 can be made of iridium (Ir) or the like.

As depicted in FIGS. 3 and 4, each upper electrode 33 extending in the sheet conveyance direction includes, at both ends in the scanning direction, two conductive parts 34 extending in the sheet conveyance direction. Each conductive part 34 is made of gold (Au). Each conductive part 34 has a width smaller than that of the upper electrode 33, but has a considerably larger thickness than that of the upper electrode 33. Providing the two conductive parts 34 having the large thickness at both ends of the upper electrode 33 in the scanning direction reduces the electrical resistance of the entire common electrode, and reducing the thickness of the upper electrode 33 extending across the upper surfaces of the piezoelectric parts 37 prevents deformation impediment which would be otherwise caused in each piezoelectric part 37. As understood from FIG. 2, the two conductive parts 34 disposed on left and right sides are electrically connected to each other at both ends in the sheet conveyance direction.

The portion (to be referred to as an active portion 37a), of each piezoelectric part 37, sandwiched between the lower electrode 31 and the upper electrode 33 is polarized upward in the thickness direction of the piezoelectric part 37, i.e., the active portion 37a is polarized in the direction oriented from the lower electrode 31 to the upper electrode 33.

As depicted in FIGS. 2 to 4, the traces 35, which correspond to the piezoelectric elements 39 respectively, are disposed on the upper surface of the vibration film 30. Each of the traces 35 is made of gold (Au). Each of the traces 35 includes a gold layer and a thin base layer. The thin base layer, called an adhesion layer or seed layer, is typically provided on the lower side of the gold layer to improve adhesiveness or to form the trace 35 through film formation, plating, or the like. The base layer is made, for example, of titanium tungsten. In the trace 35, the gold layer has a thickness, for example, in a range of 50 to 90 nm, and the base layer has a thickness, for example, in a range of 50 to 100 nm.

Each of the traces 35 is disposed as follows. Namely, one end of the trace 35 is disposed at an end of the piezoelectric part 37 of the corresponding piezoelectric element 39 on the connection part 31a side. The trace 35 extends along the upper surface of the piezoelectric part 37 to the side opposite to the active portion 37a, extends downward along the inclined side surface of the piezoelectric part 37, and covers the connection part 31a of the lower electrode 31 extending beyond the piezoelectric part 37. Namely, the one end of each trace 35 runs on the end of the piezoelectric part 37 on the connection part 31a side and the connection part 31a. Arranging a part of the trace 35 to overlap with a part of the piezoelectric part 37 enhances the connection reliability between the trace 35 and the lower electrode 31. Note that, a metal protective film 38, which protects each lower electrode 31, is formed to extend from the upper surface of the end of the piezoelectric part 37 on the connection part 31a side to the upper surface of the connection part 31 through the side surface of the piezoelectric part 37. The upper surface of the metal protective film 38 is covered with the one end of the trace 35. The metal protective film 38 protects the lower electrode 31, specifically, prevents the lower electrode 31 from being cut or scraped when the upper electrode 33 is patterned by etching. The metal protective film 38 is made of the same material as the upper electrode 33, such as iridium (Ir), through the same film-formation process as the upper electrode 33. Further, two traces 36, which are connected to each upper electrode 33, are formed on the upper surface of the vibration film 30. Each trace 36 is made of gold (Au) in a similar manner to each trace 35 connected to the lower electrode 31.

The trace 35 extends in the scanning direction parallel to the planer direction of the vibration film 30 through the position contacting with the connection part 31a of the lower electrode 31. More specifically, as depicted in FIG. 2, the traces 35 connected to the lower electrodes 31 arranged on the left side extend leftward from the lower electrodes 31 corresponding thereto, and the traces 35 connected to the lower electrodes 31 arranged on the right side extend rightward from the lower electrodes 31 corresponding thereto. Each of the traces 35 has a drive contact portion 40 at an end on the side opposite to the tower electrode 31. The drive contact portions 40 of the traces 35 are arranged, in the sheet conveyance direction, at left and right ends of the channel substrate 20 (vibration film 30). The two traces 36, which are connected to each upper electrode 33, also extend from each upper electrode 33 in the scanning direction. Each of the traces 36 has a ground contact portion 41 at an end thereof. The ground contact portions 41 are disposed into alignment with the drive contact portions 40 at left and right ends of the channel substrate 20 (vibration film 30).

For the purpose of improving the reliability of electrical connection by preventing, for example, disconnection of the trace 35, or for the purpose of reducing the electrical resistance of the trace 35, it is preferred that the thickness of the trace 35 be greater than a predetermined thickness. However, since the trace 35 is made of expensive gold, the increase in thickness of the trace 35 leads to the great increase in manufacturing costs. Thus, in this embodiment, each trace 35 is stacked on a metal part 43 to increase the substantial thickness of the trace 35 while preventing the increase in manufacturing costs.

As depicted in FIGS. 2 to 4, the metal part 43 is positioned on the lower side of each trace 35 (the side of the vibration film 30). The metal part 43 has a thickness greater than that of the trace 35 stacked thereon, as depicted in FIG. 4. For example, the thickness of the metal part 43 is not less than 200 nm. The width of the gold trace 35 is greater than that of the metal part 43 positioned on the lower side thereof. The gold trace 35 completely covers the metal part 43. The metal part 43 is formed on the vibration film 30 at a position outside the piezoelectric body 32 (piezoelectric part 37) in the scanning direction. Namely, the metal part 43 does not overlap with the piezoelectric body 37. The metal part 43 may be made of any material except for gold. It is preferred that the metal part 43 is made of a metal material having low electrical resistivity such as copper (Cu) or aluminum (Al).

As depicted in FIG. 2, a metal part 44 made of a material except for gold is disposed on the lower side of each gold trace 36 connected to each upper electrode 33 as the common electrode. This configuration, in which each trace 36 used for the common electrode is stacked on the metal part 44, increases the substantial thickness of the trace 36. The width of the gold trace 36 is greater than that of the metal part 44 positioned on the lower side thereof. The gold trace 36 completely covers the metal part 44.

As depicted in FIGS. 2 to 4, two COFs 50 are joined to left and right ends of the vibration film 30 of the channel substrate 20. Contact portions 55a of front ends of traces 55 formed in the COFs 50 are electrically connected to the drive contact portions 40 respectively. Although illustration is omitted, each COF 50 is also connected to the controller 6 (see FIG. 1) of the printer 1.

A driver IC 51 is mounted on each COF 50. The driver IC 51 generates a driving signal for driving the piezoelectric actuator 22 on the basis of a control signal transmitted from the controller 6 and outputs it. The driving signal outputted from the driver IC 51 is inputted to each drive contact portion 40 via each trace 55 of the COF 50, and then is supplied to each lower electrode 31 via each trace 35 of the piezoelectric actuator 22. The electric potential of the lower electrode 31 to which the driving signal is supplied changes between a predetermined driving potential and a ground potential. Each COF 50 also includes ground traces (not depicted), and the ground traces are electrically connected to the ground contact portions 41 of the piezoelectric actuator 22. Thus, the electric potential of the upper electrodes 33 connected to the ground contact portions 41 is always kept in the ground potential.

When the contact portions 55a of the traces 55 of the COFs 50 are made of gold, it is preferred that the contact portions 55a of the traces 55 of the COFs 50 be diffusion-joined to the drive contact portions 40 of the traces 35. For example, pressing the COB 50 against the channel substrate 20 while heating the channel substrate 20 diffuses gold atoms between the drive contact portions 40 of the traces 35 and the contact portions 55a of the COFs 50 which are made of the same material, thereby joining the drive contact portions 40 and the contact portions 55a. If the joining or bonding is performed by using an electrically conductive joining material such as solder, the joining material flows out to the circumference. Thus, when the traces 35 are disposed at a narrow pitch, the traces 35 disposed adjacently to each other are liable to have short circuit. The diffusion-joining, however, causes no short circuit between the traces 35 disposed adjacently to each other at the narrow pitch. Namely, the diffusion-joining can join the contact portions 55a of the traces 55 of the COFs 50 and the drive contact portions 40 of the traces 35 without suffering from the above problem.

An explanation will be made about the operation of the piezoelectric actuator 22 at the time of supplying the driving signal from the driver IC 51. The electric potential of the lower electrode 31 is the ground potential in a state that no driving signal is supplied, and thus the electric potential of the lower electrode 31 is the same as that of the upper electrode 33 in this state. When the driving signal is supplied to the lower electrode 31 kept in the ground potential so that the driving potential is applied thereto, the potential difference between the lower electrode 31 and the upper electrode 33 occurs. This generates an electric field in the active portion 37a of the piezoelectric part 37. The electric field is parallel to the thickness direction of the piezoelectric part 37. Since the polarization direction of the active portion 37a is coincident with the direction of the electric field, the active portion 37a extends in its thickness direction being the polarization direction, and contracts in its planer direction. The contraction deformation of the active portion 37a bends the vibration film 30, so that the vibration film 30 becomes convex toward the pressure chamber 26. This reduces the volume of the pressure chamber 26 to generate the pressure wave in the pressure chamber 26, thereby discharging liquid droplets of ink from the nozzle 24 communicating with the pressure chamber 26.

<Reservoir Forming Member>

As depicted in FIG. 4, the reservoir forming member 23 is disposed on the opposite side (upper side) of the channel substrate 20 with the piezoelectric actuator 22 interposed therebetween. The reservoir forming member 23 is joined to the upper surface of the piezoelectric actuator 22. Similar to the channel substrate 20, the reservoir forming member 23 may be made, for example, of silicon. Or, the reservoir forming member 23 may be made, for example, of a material except for silicon, such as a metal material or synthetic resin material.

As depicted in FIG. 4, a reservoir 52 extending in the sheet conveyance direction is formed at an upper half part of the reservoir forming member 23. The reservoirs 52 are connected to the cartridge holder 7 (see FIG. 1) to which the ink cartridges 17 are attached via unillustrated tubes.

Ink supply channels 53 extending downward from the reservoir 52 are formed at a lower half part of the reservoir forming member 23. The ink supply channels 53 communicate with the communicating holes 30a formed in the vibration film 30 of the piezoelectric actuator 22. This configuration supplies the ink from the reservoir 52 to the pressure chambers 26 of the channel substrate 20 via the ink supply channels 53 and the communicating holes 30a. A protective cover 54 is formed at the lower half part of the reservoir forming member 23 to cover the piezoelectric elements 39 of the piezoelectric actuator 22. The protective cover 54 has no wall on the side opposite to the ink supply channels 53 (right side in FIG. 4), and thus the space where the piezoelectric elements 39 are accommodated opens sideward.

Next, an explanation will be made about a step of manufacturing the ink-jet head 4 with reference to FIGS. 5A to 5C, FIGS. 6A to 6D, and FIGS. 7A to 7C. Especially, the explanation will focus on a step of manufacturing the piezoelectric actuator 22.

Figure 5A:
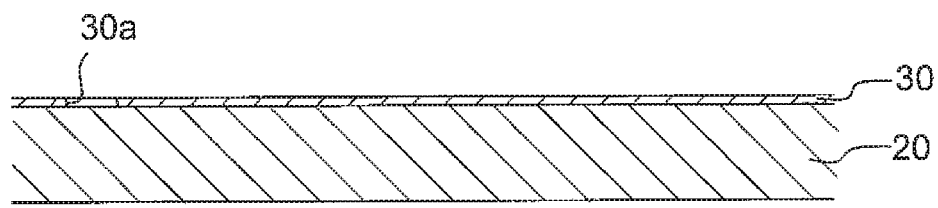
Figure 5B:
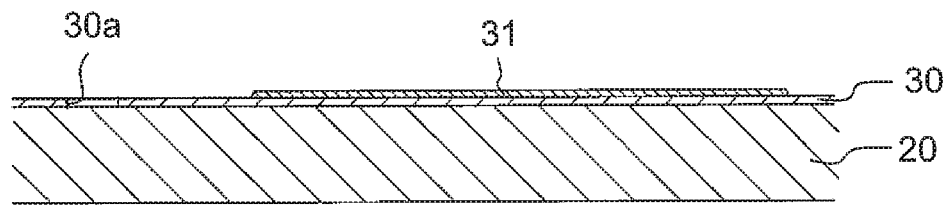
Figure 5C:
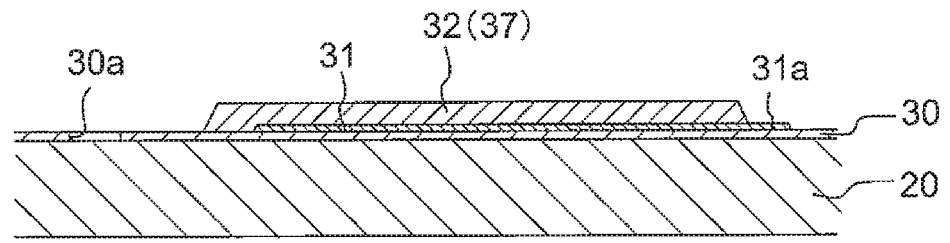

In this embodiment, the piezoelectric actuator 22 including the piezoelectric elements 39 is manufactured by sequentially stacking various films on the vibration film 30 of the channel substrate 20 through a film formation step such as spattering and a patterning step such as etching to be repeatedly performed. As depicted in FIG. 5A, the vibration film 30 such as silicon dioxide is at first formed on the surface of the channel substrate 20 by thermal oxidation or the like. Further, the communicating hole 30a is formed on the vibration film 30 by etching. Next, as depicted in FIG. 5B, each lower electrode 31 made of platinum is formed on the vibration film 30. Then, as depicted in FIG. 5C, a piezoelectric material film is formed on each lower electrode 31 by a sol-gel method or spattering, and the piezoelectric material film is patterned by etching. Accordingly, the piezoelectric body 32 (piezoelectric part 37) is formed. At the time of forming the piezoelectric material film, thermal treatment for annealing is performed as appropriate.

Figure 6A:
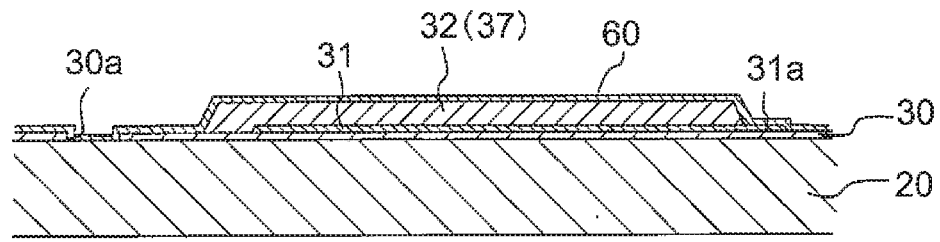
Figure 6B:
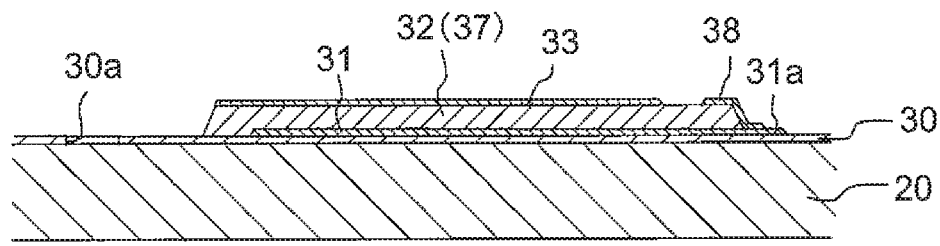
Figure 6C:
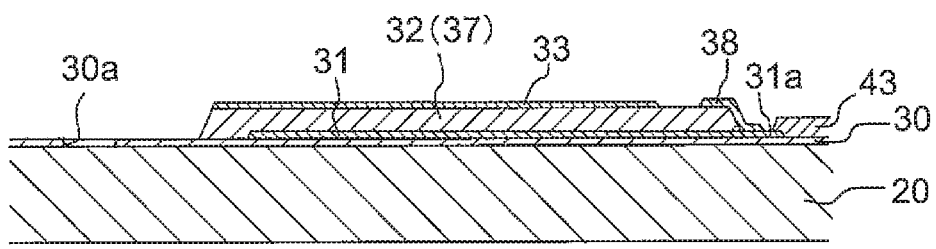
Figure 6D:
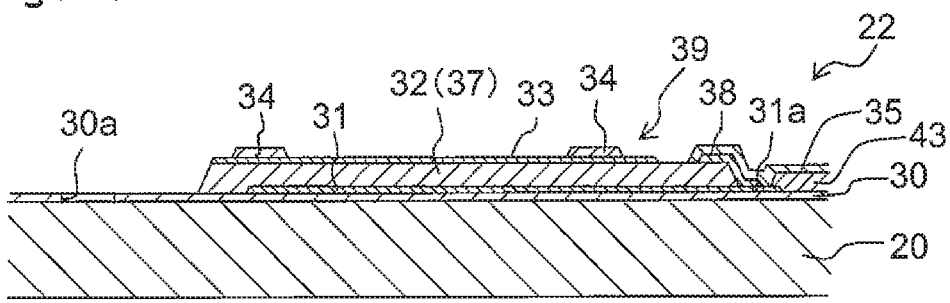

As depicted in FIG. 6A, a conductive film 60, such as iridium, which will be the upper electrode 33, is formed on the upper surface of the piezoelectric body 32. Next, as depicted in FIG. 6B, the conductive film 60 is etched to form the upper electrode 33 and the metal protective film 38 at the same time. Next, as depicted in FIG. 6C, the metal part 43, which is made of a metal material other than gold, is formed on a part, of the upper surface of the vibration film 30, where the trace 35 is to be formed thereon. Next, as depicted in FIG. 6D, the trace 35 and the conductive parts 34 are formed. Namely, the gold trace 35 is formed on the metal protective film 38 and the metal part 43 and the gold conductive parts 34 are fumed on the upper electrode 33. The gold trace 35 and the gold conductive parts 34 can be formed, for example, by plating at the same time. In the plating, a resist pattern is at first formed, and then a seed layer, which is a base layer, is formed on an area having no resist pattern. Next, the resist pattern is peeled off and a gold layer is formed on the seed layer by plating. Namely, the trace 35 is formed of two layers including the seed layer as the base layer and the gold layer formed on the seed layer.

The manufacture of the piezoelectric actuator 22 having the piezoelectric elements 39 is completed by performing the above steps.

In FIGS. 6A to 6C, the metal part 43 is formed after the formation of the lower electrode 31, the piezoelectric body 32, and the upper electrode 33. The metal part 43, however, may be formed before the formation of the lower electrode 31, the piezoelectric body 32, and the upper electrode 33. Namely, the formation of the piezoelectric body 32 (film formation, etching) may be performed after the formation of the metal part 43. Or, the formation of the lower electrode 31, the formation of the piezoelectric body 32, and the like may be performed after the formation of the metal part 43.

Figure 7A:
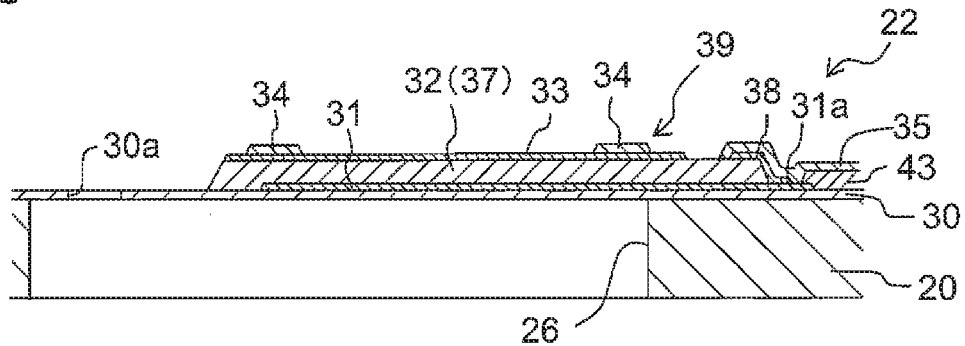
Figure 7B:
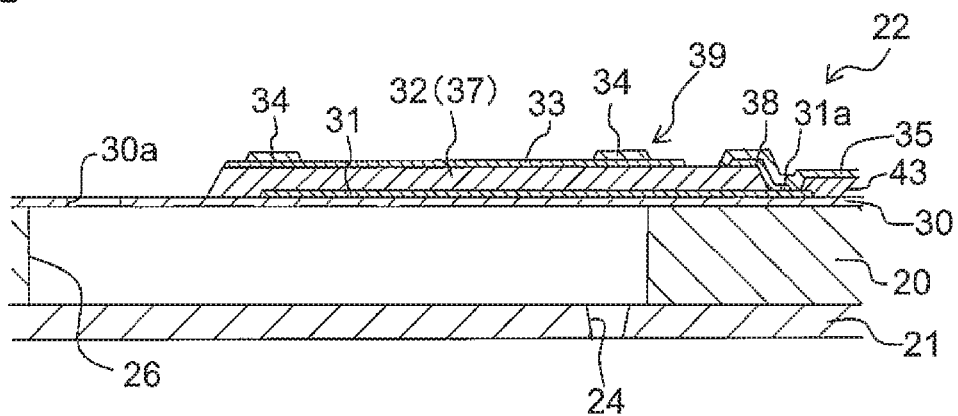
Figure 7C:
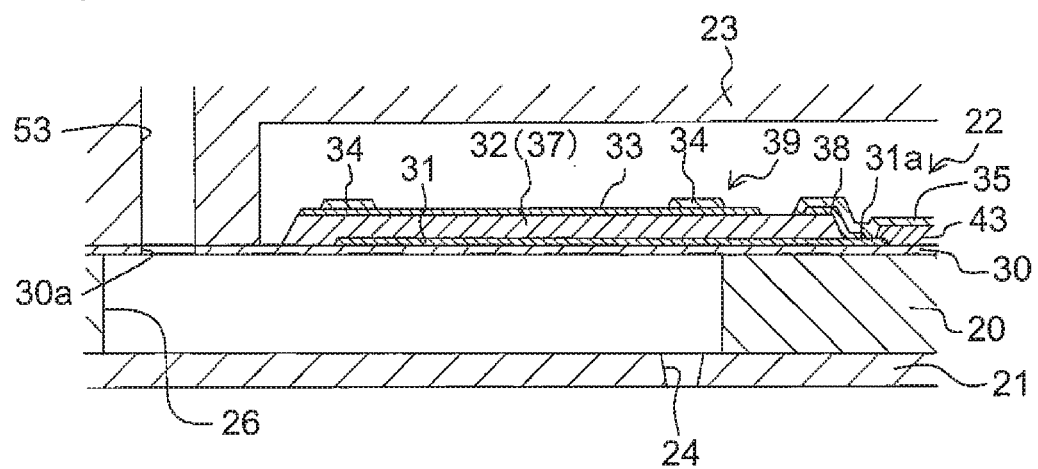

As depicted in FIG. 7A, the channel substrate 20 is etched from its lower surface on the side opposite to the piezoelectric actuator 22, thereby forming the pressure chamber 26. Next, as depicted in FIG. 7B, the nozzle plate 21 is joined to the lower surface of the channel substrate 20 by adhesive. Lastly, as depicted in FIG. 7C, the reservoir forming member 23 is joined to the piezoelectric actuator 22 by adhesive.

In the embodiment, the trace 35 connected to the lower electrode 31 is stacked on the metal part 43, and thus the substantial thickness of the trace 35 has become thick, as depicted in FIG. 4. This prevents disconnection of the trace 35, thereby improving the reliability of electrical connection. Further, the effect of reducing substantial electrical resistance of the trace 35 can be obtained. Especially, when the metal part 43 is thicker than the trace 35, the reliability of electrical connection of trace 35 greatly improves and the substantial electrical resistance of trace 35 greatly lowers.

The metal part 43 is made of a metal material except for gold. Using inexpensive metal material for the metal part 43 can reduce material costs, enhance the reliability of electrical connection of the trace 35, and reduce the electrical resistance of trace 35. As depicted in FIG. 2, the traces 36 connected to the upper electrodes 33 as the common electrodes are stacked on the metal parts 44. Thus, the traces 36 used for the common electrodes can have improved electrical connection reliability and lowered electrical resistance.

As depicted in FIGS. 2 and 3, the widths of the traces 35, 36 made of gold are respectively greater than the widths of the metal parts 43, 44. Covering the metal parts 43, 44 with the gold traces 35, 36 prevents the deterioration of the metal parts 43, 44 made of a material except for gold.

The metal parts 43 are disposed only in areas, of the vibration film 30, which do not overlap with the pressure chambers 26. This allows the vibration film 30 and the piezoelectric parts 37 covering the pressure chambers 26 to be deformed without being impeded.

In the above embodiment, the ink-jet head 4 corresponds to a liquid discharge apparatus of the present teaching. The lower electrode 31 corresponds to a first electrode of the present teaching. The upper electrode 33 corresponds to a second electrode of the present teaching. The traces 35, 36 each correspond to a gold trace of the present teaching. The metal parts 43, 44 each correspond to a first metal part of the present teaching. Each of the COFs 50 corresponds to a wiring member of the present teaching.

Subsequently, an explanation will be made about modified embodiments in which various changes or modifications are added to the above embodiment. The constitutive parts or components, which are the same as or equivalent to those of the above embodiment, are designated by the same reference numerals, any explanation of which will be omitted as appropriate.

In the above embodiment, the traces 35 connected to the lower electrodes 31 and the traces 36 connected to the upper electrodes 33 are stacked on the metal parts 43, 44 respectively. However, one of the traces 35, 36 may not be stacked on the corresponding metal parts. When the traces 35 connected to the lower electrodes 31 are compared to the traces 36 connected to the upper electrodes 33, the traces 36 (two traces 36 in the above embodiment) can be connected with each upper electrode 33 as the common electrode, whereas only one fine trace (the trace 35) is connected with each lower electrode 31 as the individual electrode. Thus, in view of obtaining the reliability of electrical connection, it is preferred that the traces 35 connected to the lower electrodes 31 as the individual electrodes are stacked on the metal parts 43.

In the above embodiment, the metal parts 43, 44 disposed on the lower side of the traces 35, 36 are thicker than the traces 35, 36 disposed on the upper side of the metal parts 43, 44. The thicknesses of the metal parts 43, 44, however, may be the same as or thinner than the thicknesses of the traces 35, 36.

In the above embodiment, the piezoelectric parts 37 of the piezoelectric elements 39 arranged in a nozzle arrangement direction (sheet conveyance direction) are connected to each other to form one piezoelectric body 32, as depicted in FIGS. 2 and 3. The piezoelectric parts 37 of the piezoelectric elements 39, however, may be separated from each other.

In the above embodiment, the piezoelectric actuator 22 includes the lower electrodes 31, each of which is the individual electrode individually provided for each of the piezoelectric elements 39, and the upper electrodes 33, each of which is the common electrode commonly provided for the piezoelectric elements 39. The present teaching, however, can be applied to piezoelectric elements of which electrodes are reversely arranged relative to the arrangement of the above embodiment, i.e., piezoelectric elements each including a lower electrode as the common electrode and an upper electrode as the individual electrode.

Figure 8:
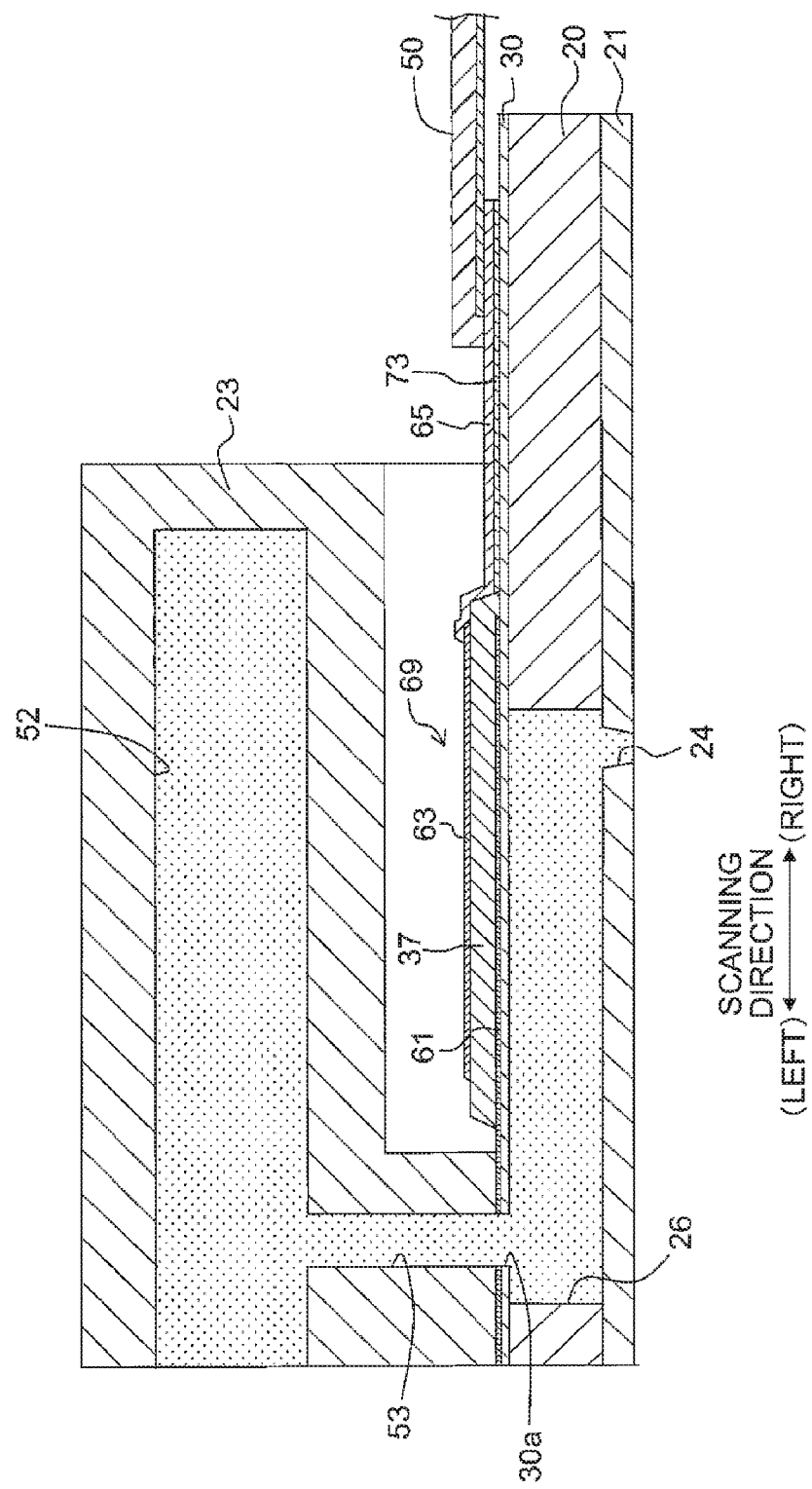
FIG. 8 is a cross-sectional view of an ink-jet head according to a modified embodiment.

In a piezoelectric element 69 depicted in FIG. 8, a trace 65 made of gold is connected to an upper electrode 63 as the individual electrode which is disposed on the upper surface of the piezoelectric part 37. The trace 65 extends from the upper surface of an end (right end in FIG. 8) of the upper electrode 63, extends downward along the side surface of the piezoelectric part 37, and extends along the vibration film 30 with a metal part 73 interposed between the trace 65 and the vibration film 30. The metal part 73 is disposed on the lower side (the vibration film 30 side) of the trace 65.

When the lower electrode 61 is made of expensive platinum, it is preferred that the lower electrode 61 is thin to reduce costs. However, when the lower electrode 61, which is the common electrode, has a small thickness, the electrical resistance of the common electrode increases. This causes a harmful effect on the behaviors (responsiveness and the like) of each piezoelectric element 69.

Figure 9:
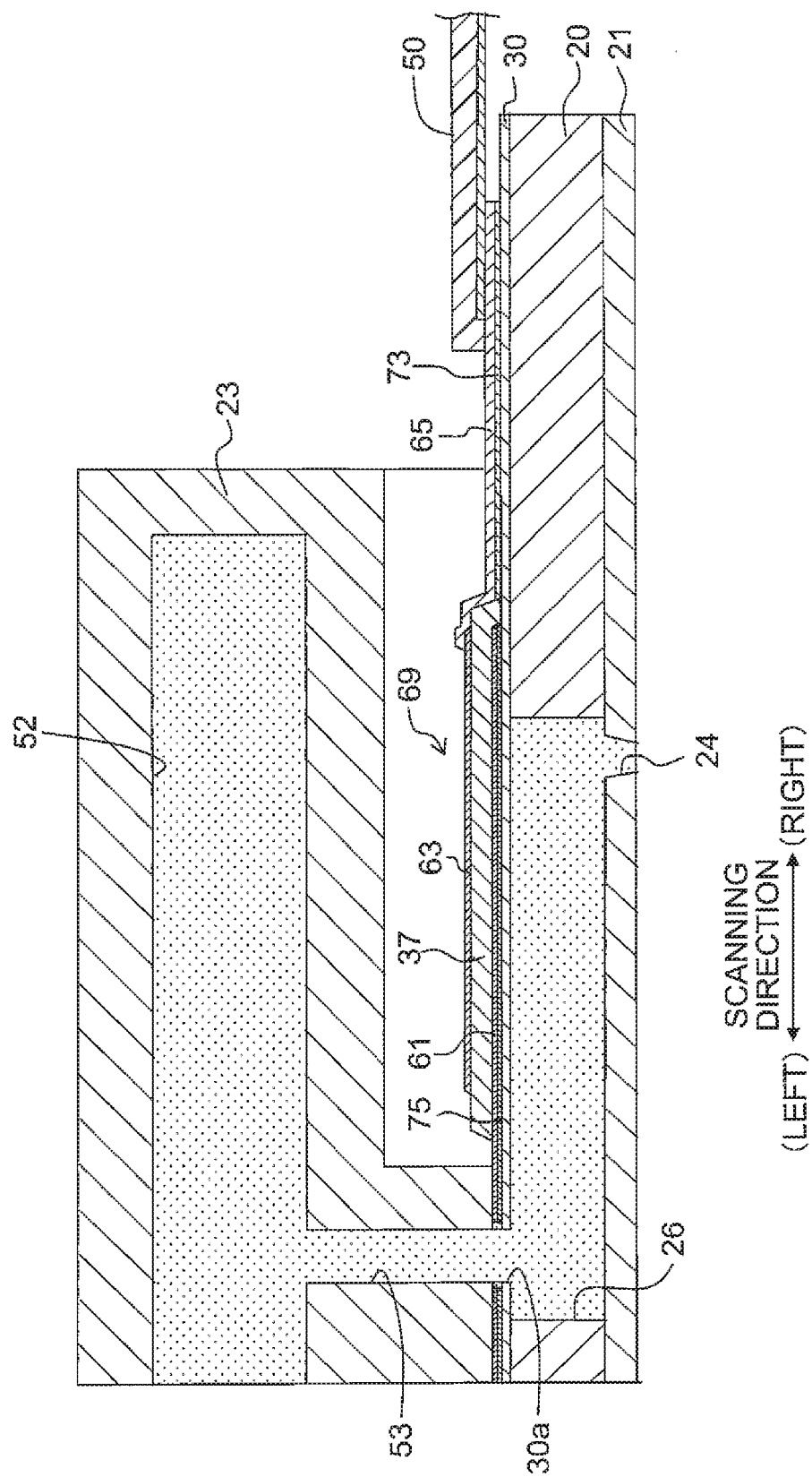
FIG. 9 is a cross-sectional view of an ink-jet head according to another modified embodiment.

Thus, as depicted in FIG. 9, the lower electrode 61 made of platinum may be stacked on a metal part 75 made of a material other than platinum. It is preferred that the metal part 75 is made of the same material (a material other than gold and platinum) as the metal part 73, which is disposed on the lower side of the gold trace 65 connected to the upper electrode 63, through the same film formation process. In this configuration, the trace 65 connected to the upper electrode 63 is stacked on the metal part 73 and the lower electrode 61 is stacked on the metal part 75. Thus, two metal parts 73, 75 are separated from each other, namely, they are not electrically connected to each other. The metal part 75 in the embodiment depicted in FIG. 9 corresponds to a second metal part of the present teaching.

As described above, the lower electrode 61 as the common electrode is stacked on the metal part 75 made of a material other than gold and platinum. Thus, the thickness of the lower electrode 61 made of platinum can be reduced to prevent material cost increase, and the substantial electrical resistance of the lower electrode 61 can be reduced. For example, the thickness of the lower electrode 61 made of platinum can be reduced to 0.1 µm or less (preferably, 0.05 µm or less). The metal part 75 is made of the same material as the metal part 73 disposed on the lower side of the trace 65 through the same film formation process, and thus no process is added to form the metal part 75.

The material of the metal part 75 is not especially limited provided that the material is other than gold and platinum. However, when the manufacturing steps of the piezoelectric actuator include a heating process under high temperature (for example, annealing of the piezoelectric part 37), it is preferred that the metal part 75 is made of a metal material with a high melting point such as zirconium, tantalum, or tungsten.

In FIG. 9, the metal part 75 is disposed on the lower side (the vibration film 30 side) of the lower electrode 61 made of platinum. The metal part 75, however, may be disposed on the upper side of the lower electrode 61. Note that, various heating processes, such as the annealing of the piezoelectric material film as described above, are performed in the manufacture of the piezoelectric actuator 22. One of the reasons the lower electrode 61 is made of platinum is because metal atoms constituting the lower electrode 61 are less likely to diffuse to the piezoelectric part 37 during various heating processes, such as the annealing of the piezoelectric part 37. That is, when the metal part 75 made of a material other than platinum is stacked on the lower electrode 61 made of platinum, metal constituting the metal part 75 is more likely to diffuse to the piezoelectric part 37 during heating processes. Thus, it is preferred that the metal part 75 is disposed on the lower side of the lower electrode 61 made of platinum, as depicted in FIG. 9.

In FIG. 9, the metal part 75 disposed on the lower side of the lower electrode 61 has the same thickness as the metal part 73 disposed on the lower side of the trace 65. The two metal parts 73, 75, however, may have mutually different thicknesses. Especially, since the metal part 75 is disposed on the lower side of the lower electrode 61 so that the piezoelectric part 37 overlaps with the metal part 75, the metal part 75 having a very large thickness impedes the deformation of the piezoelectric part 37. Thus, the metal part 75 disposed on the lower side of the lower electrode 61 may be thinner than the metal part 73 disposed on the lower side of the trace 65. Such a configuration can be obtained, for example, as follows. Namely, two metal parts 73, 75 are formed through the same film formation process, and then etching is performed for the metal part 75 to reduce the thickness thereof.

Figure 10A:
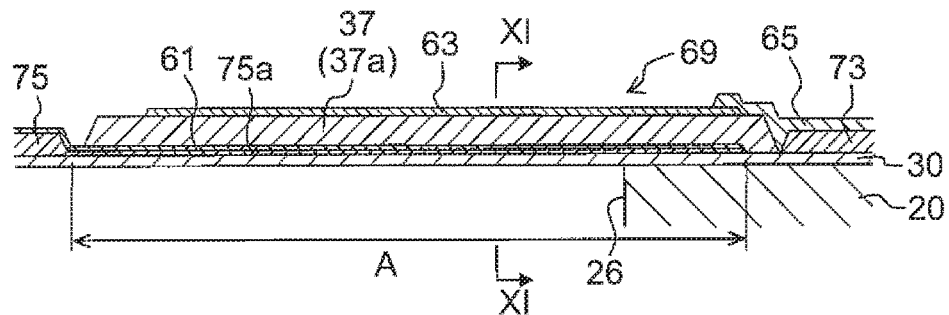
FIGS. 10A to 10E each depict a cross-section of the vicinity of a piezoelectric actuator of an ink-jet head according to still another modified embodiment.

When the lower electrode 61 is stacked on the metal part 75, the metal part 75 impedes the deformation of the piezoelectric part 37. Thus, as depicted in FIG. 10A, the thickness of the metal part 75 in a first area A of the lower electrode 61 may be a smaller than a thickness of the metal part 75 in other areas. The first area A includes an area which faces at least the upper electrode 63 with the piezoelectric part 37 interposed therebetween (an area on which the active portion 37a is disposed). In this configuration, the metal part 75 is less likely to impede the deformation of the piezoelectric part 37. Further, the metal part 73 disposed on the lower side of the trace 35 and the metal part 75 disposed on the lower side of the lower electrode 61 are formed through the same film formation process in this configuration.

Figure 10B:
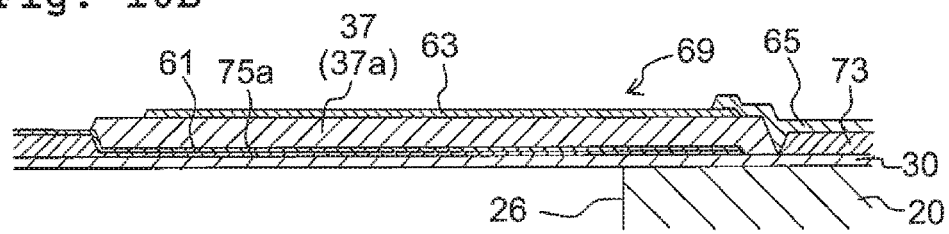

In FIG. 10A, a part (left end in FIG. 10A) of a thin portion 75a of the metal part 75 is exposed from the piezoelectric part 37. In this case, when a process, such as patterning of the upper electrode 63 through dry etching, is performed after formation of the piezoelectric part 37, the lower electrode 61 made of platinum is cut or scraped. This may cause a part of the piezoelectric element 69 to have a small thickness. To solve such a problem in which the film thickness becomes partially thin in the subsequent step, the part, of the metal part 75, exposed from the piezoelectric part 37 may have a thickness larger than an unexposed part of the metal part 75. Alternatively, as depicted in FIG. 10B, the piezoelectric part 37 may cover the entire thin portion 75a of the metal part 75 stacked on the lower electrode 61.

Figure 11:
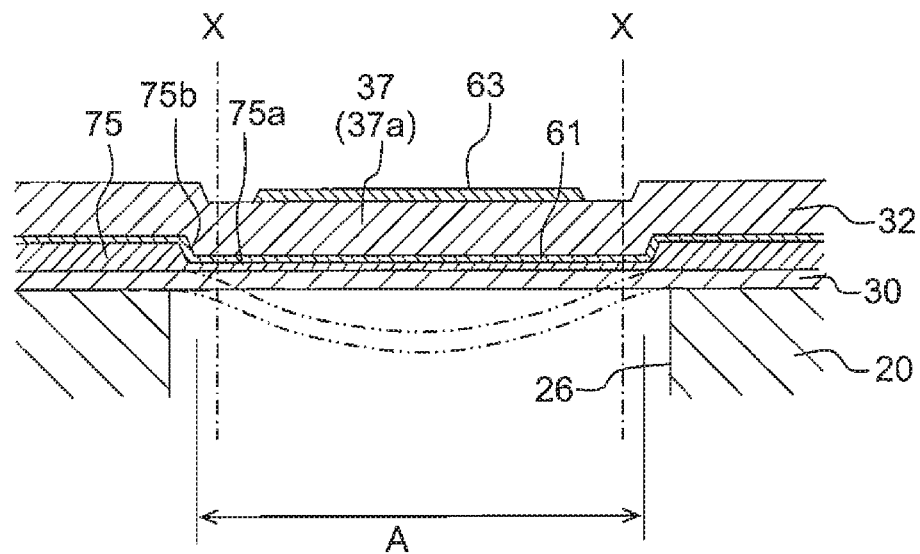
FIG. 11 is a cross-sectional view taken along the line XI-XI in FIG. 10A.

FIG. 11 is a cross-sectional view taken along the line XI-XI in FIG. 10A. As depicted in FIG. 11, the potential difference generated between the upper electrode 63 and the lower electrode 61 contracts the piezoelectric part 37, thereby bending the vibration film 30 as depicted by two-dot chain lines in FIG. 11. In this situation, steps 75b of the metal part 75 (i.e., outer periphery of an area, of the lower electrode 61, stacked on the thin portion 75a) are preferably disposed on the outer sides of positions (positions X depicted by dot-and-dash lines) where the deformation curvature of the vibration film 30 obtained when the vibration film 30 is bent by the deformation of the piezoelectric part 37 is maximum. Namely, the metal part 75 has a small thickness at the positions where the vibration film 30 has greatest deformation or curve, and thus the metal part 75 is less likely to impede the bending of the vibration film 30 due to the deformation of the piezoelectric part 37.

Figure 10C:
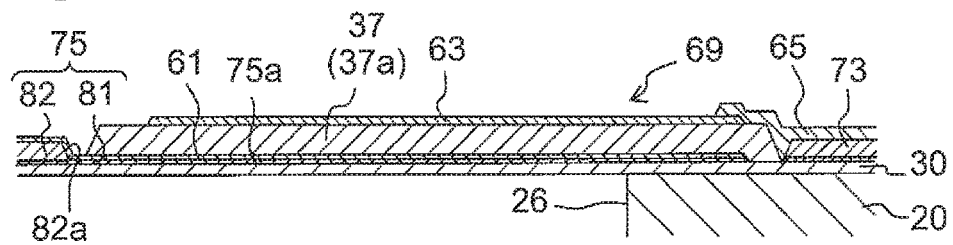

The metal part 75 may be formed of a plurality of layers. In FIG. 10C, the metal part 75 disposed on the lower side of the lower electrode 61 includes two layers, i.e., a first layer 81 disposed on the lower side and a second layer 82 disposed on the upper side. The metal part 75 formed of the plurality of layers has the following advantages.

When the metal part 75 formed of one layer is etched to have thin portions 75a, an etching error may cause the thin portions 75a positioned below the active portions 37a to have different thicknesses among piezoelectric elements 69. When thicknesses of the thin portions 75a vary among the piezoelectric elements 69, deformation characteristics vary among the piezoelectric parts 37 and discharge characteristics vary among the nozzles 24. In the configuration depicted in FIG. 10C, however, the metal part 75 has two layers including the lower first layer 81 and the upper second layer 82. At first, the first layer 81 is formed on almost the entire upper surface of the vibration film 30. Next, the second layer 82 is formed on the first layer 81. Then, only the second layer 82 is etched to remove the second layer 82 disposed in the first area A, thereby forming the thin portion 75a of the metal part 75. Namely, no etching is performed for the first layer 81, and thus the thickness of the thin portion 75a means the thickness of the first layer 81. The variation in thicknesses of thin portions 75a of the piezoelectric elements 69 is prevented, accordingly. Further, as depicted in FIG. 10C, an edge 82a, which is formed by partially removing the second layer 82 through etching, is preferably formed into an inclined surface so that the lower electrode 61 is easily formed on the edge 82a through sputtering or the like in a subsequent step. Or, the edge 82a of the second layer 82 may be in a shape of stairs.

Figure 10D:
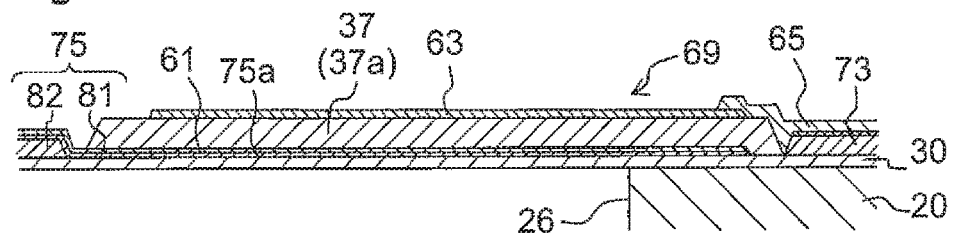
Figure 10E:
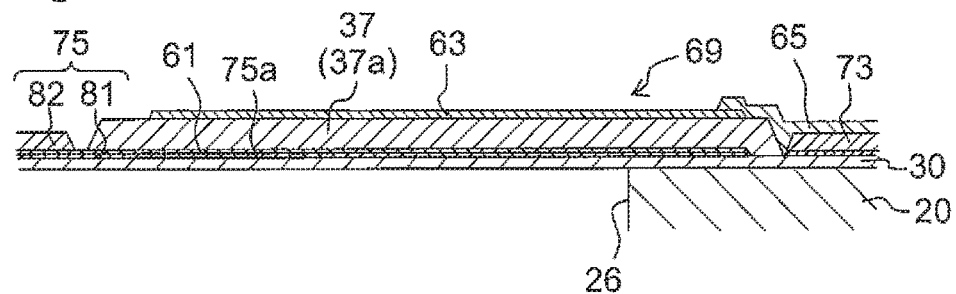

As depicted in FIG. 10D, the second layer 82 to be etched may be the lower layer, and the first layer 81 may be the upper layer. Further, as depicted in FIG. 10E, the first layer 81 may be disposed on the lower side of the lower electrode 61 and the second layer 82 may be disposed on the upper side of the lower electrode 61 so that they sandwich the lower electrode 61 made of platinum in an up-down direction.

The material(s) of the first layer 81 and the second layer 82 is(are) not especially limited, provided that the first layer 81 and the second layer 82 are made of a metal material except for gold and platinum. However, as depicted in FIG. 10C, when etching is performed for the second layer 82 formed on the first layer 81 after formation of the first layer 81, it is preferred that the first layer 81 and the second layer 82 are made of mutually different materials. This is because, the lower first layer 81 made of a material different from that of the second layer 82 is less likely to be etched when wet etching is performed for the upper second layer 82. Meanwhile, as depicted in FIG. 10D, when etching is performed for the second layer 82 before formation of the first layer 81, the first layer 81 and the second layer 82 can be made of the same material without any problems.

When etching is performed for the second layer 82, over-etching or under-etching may occur. The over-etching removes not only the second layer 82 but also the layer disposed on the lower side of the second layer 82. The under-etching fails to etch the second layer 82 sufficiently. Here, the following manner is also allowable from another point of view. For example, when the lower first layer 81 is required to reliably have a certain thickness in the configuration depicted in FIG. 10C, the under-etching may be purposefully performed for the second layer 82 so as not to remove the first layer 81 through etching of the second layer 82. Further, as depicted in FIG. 10E, when the second layer 82 to be etched is disposed on the lower electrode 61 made of platinum, the over-etching may be purposefully performed for the second layer 82 to reliably expose the lower electrode 61.

Figure 12:
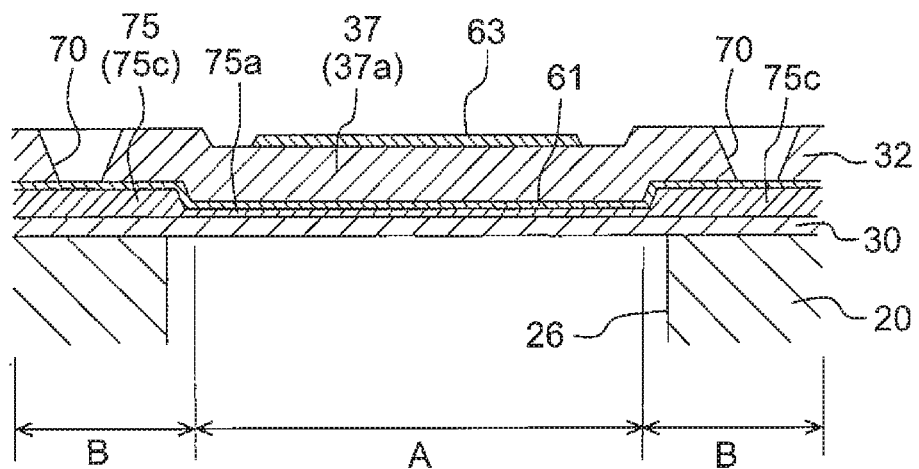
FIG. 12 is a cross-sectional view, of an ink-jet head according to yet another modified embodiment, which corresponds to FIG. 11.

As depicted in FIG. 12, slits 70 may be formed at parts, of the piezoelectric part 37, positioned on outer sides of the active portion 37a, i.e. parts, of the piezoelectric part 37, disposed in second areas B different from the first area A. This configuration facilitates the deformation of the active portion 37a of the piezoelectric part 37. In the second areas B, thick portions 75c of the second metal part 75 are disposed on the lower side of the lower electrode 61. The thick portions 75c of the second metal part 75 disposed on the lower side of the lower electrode 61 allow the lower electrode 61 to have a substantial thickness, even if the lower electrode 61 disposed on the lower side of the piezoelectric part 37 is cut or scraped at the time of forming the slits 70 in the piezoelectric part 37 through etching (especially, dry-etching).

Figure 13A:
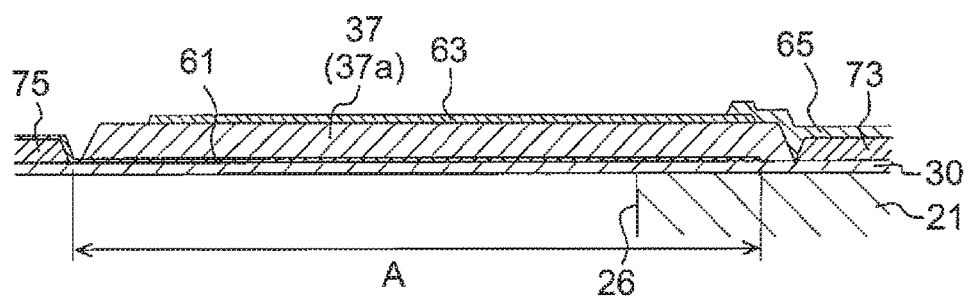
FIGS. 13A and 13B each depict a cross-section of the vicinity of a piezoelectric actuator of an ink-jet head according to further modified embodiment.
Figure 13B:
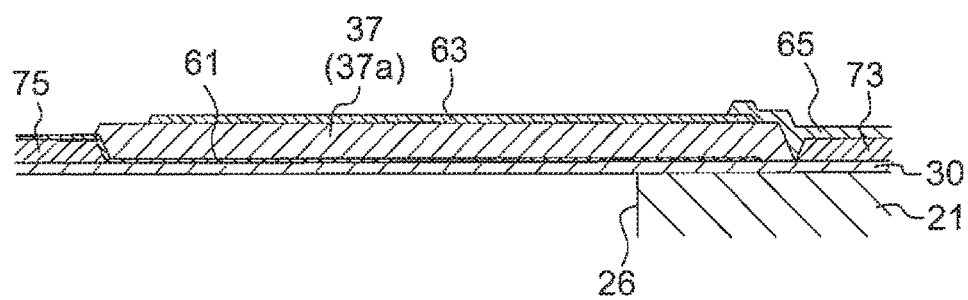

FIG. 10A depicts an example in which the metal part 75 in the first area A has a smaller thickness. Instead of this configuration, the metal part 75 may not be formed in the first area A as depicted in FIG. 13A. Since the metal part 75 provided in this configuration does not impede the deformation of the piezoelectric part 37, the embodiment depicted in FIG. 13A can obtain the effect of preventing the deformation impediment in the piezoelectric part 37, similar to the embodiment depicted in FIG. 10A. Further, as depicted in FIG. 13B, a part of the lower electrode 61 where no metal part 75 is provided may be entirely covered with the piezoelectric part 37, similar to the embodiment depicted in FIG. 10B. Note that a boundary between a part of the lower electrode 61 having the metal part 75 on its lower side and a part of the lower electrode 61 having no metal part 75 on its lower side is preferably positioned on the outer side of the position where the deformation curvature of the vibration film 30 obtained when the vibration film 30 is bent by the deformation of the piezoelectric part 37 is maximum.

Figure 14:
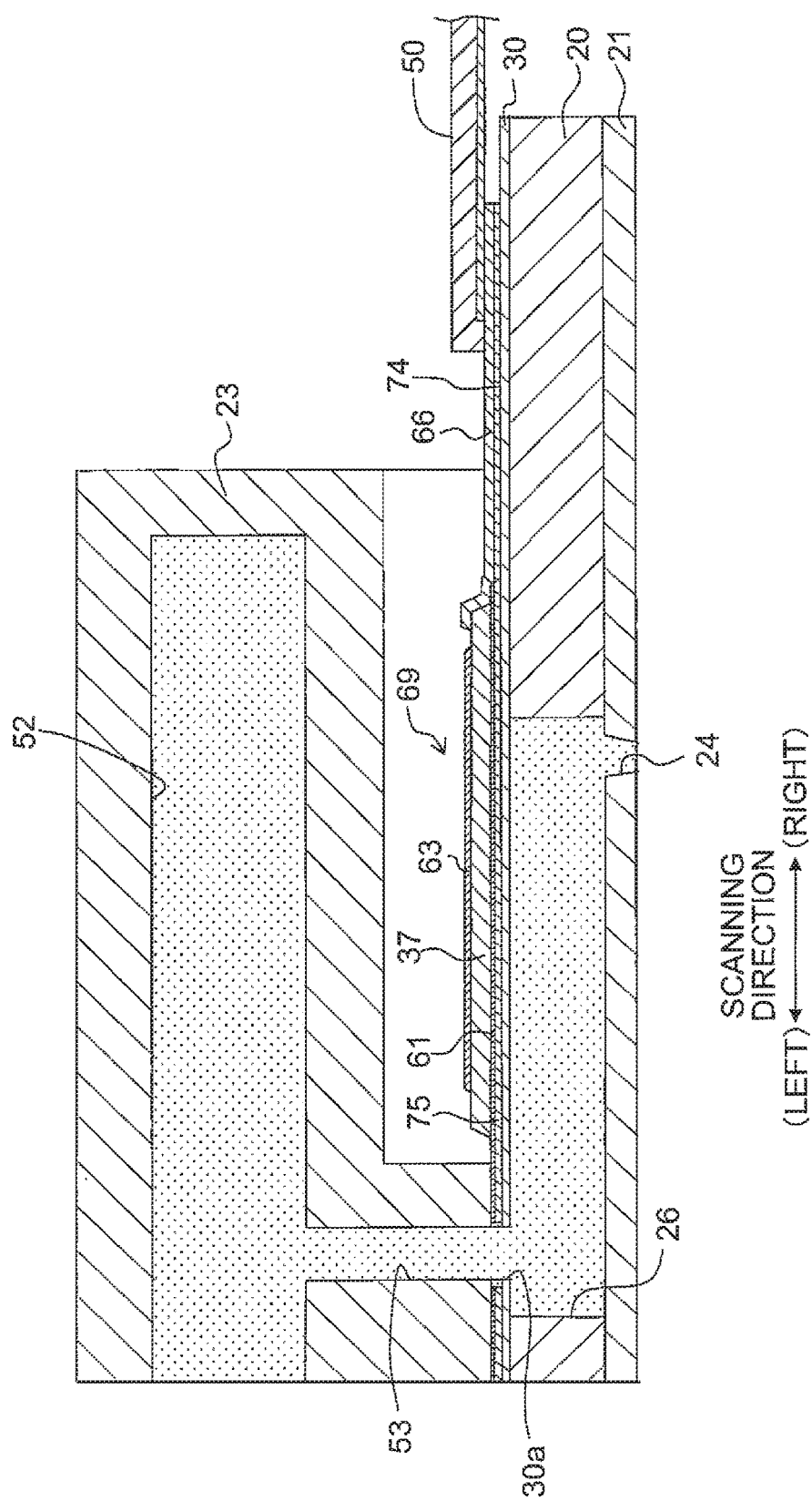
FIG. 14 is a cross-sectional view of an ink-jet head according to still further modified embodiment.

As depicted in FIG. 14, the metal part 75 disposed on the lower side of the lower electrode 61 as the common electrode may be electrically connected to the metal part 74 disposed on the lower side of the gold trace 66 connected to the lower electrode 61. Although the illustration of the trace connected to the upper electrode 63 is omitted in FIG. 14, the trace connected to the upper electrode 63 is disposed on the upper surface of the vibration film 30 to be deviated, in a direction perpendicular to the paper surface of FIG. 14, from the trace 66 connected to the lower electrode 61 depicted in FIG. 14.

The configuration of ink channel of the ink-jet head 4 is not limited to that of the above embodiment. For example, the configuration of the ink channel can be modified as follows. In the above embodiment, the ink channel is configured so that the ink is supplied from the reservoir 52 in the reservoir forming member 23 to the pressure chambers 26 via the communicating holes 30a, as depicted in FIG. 4. Instead of the above configuration, a channel corresponding to the reservoir 52 may be formed in the channel substrate 20. For example, the following configuration is also allowable. That is, a manifold channel extending in the arrangement direction of the pressure chambers 26 is formed in the channel substrate 20, and the ink is supplied to each of the pressure chambers 26 from the manifold channel.

In the above embodiment, as depicted in FIG. 2, the lower electrodes 31 as the individual electrodes form two rows, and the traces 35 are respectively drawn from the lower electrodes 31 to the outside in the scanning direction. Instead of the above configuration, the traces 35 may be respectively drawn from the lower electrodes 31 to the inside in the scanning direction, and the drive contact portions 40 may be disposed between two rows of the lower electrodes 31. Or, the traces 35 may be drawn from all of the lower electrodes 31 forming two rows to one side in the scanning direction.

In the embodiment and the modified embodiments as described above, the present teaching is applied to a piezoelectric actuator of an ink-jet head which discharges ink on a recording sheet to print an image etc. The present teaching, however, can be also applied to a liquid discharge apparatus used in various uses other than the printing of the image etc. For example, the present teaching can be also applied to a liquid discharge apparatus which discharges a conductive liquid on a board to form a conductive pattern on the surface of the board.

What is claimed is:

1. A liquid discharge apparatus, comprising:
   a pressure chamber;
   a film covering the pressure chamber;
   a piezoelectric element disposed on the film and including a piezoelectric part, a first electrode, and a second electrode, wherein the first electrode is disposed on a first side of the piezoelectric part facing the pressure chamber, and the second electrode is disposed on a second side of the piezoelectric part opposite the first side;
   a gold trace connected to the first electrode or the second electrode; and
   a first metal part made of a metal material except for gold and positioned between the film and the gold trace, the first metal part being disposed only in an area of the film, which does not overlap with the pressure chamber, wherein the first metal part is laminated with the gold trace.

2. The liquid discharge apparatus according to claim 1, wherein the first metal part is thicker than the gold trace.

3. The liquid discharge apparatus according to claim 1, wherein the gold trace is wider than the first metal part.

4. The liquid discharge apparatus according to claim 1, wherein the first metal part is made of copper or aluminum.

5. A liquid discharge apparatus, comprising:
   a pressure chamber;
   a film covering the pressure chamber;
   a piezoelectric element disposed on the film and including a piezoelectric part, a first electrode, and a second electrode, wherein the first electrode is disposed on a first side of the piezoelectric part facing the pressure chamber, and the second electrode is disposed on a second side of the piezoelectric part opposite the first side;
   a gold trace connected to the first electrode or the second electrode; and
   a first metal part made of a metal material except for gold and positioned between the film and the gold trace,
   wherein the first metal part is laminated with the gold trace,
   wherein a part of the first electrode extends beyond the piezoelectric part to an area outside of the pressure chamber, and
   wherein the gold trace is disposed to cover the part of the first electrode extending beyond the piezoelectric part and the gold trace partially overlaps with the piezoelectric part.

6. A liquid discharge apparatus, comprising:
   a pressure chamber;
   a film covering the pressure chamber;
   a piezoelectric element disposed on the film and including a piezoelectric part, a first electrode, and a second electrode, wherein the first electrode is disposed on a first side of the piezoelectric part facing the pressure chamber, and the second electrode is disposed on a second side of the piezoelectric part opposite the first side;
   a gold trace connected to the first electrode or the second electrode; and
   a first metal part made of a metal material except for gold and positioned between the film and the gold trace,
   wherein the first metal part is laminated with the gold trace,
   wherein the gold trace includes a gold layer and a base layer disposed on a lower side of the gold layer and having a thickness smaller than a thickness of the gold layer,
   wherein the thickness of the base layer is in a range of 50 to 100 nm, and
   wherein the first metal part has a thickness of not less than 200 nm.

7. A liquid discharge apparatus, comprising:
   a pressure chamber;
   a film covering the pressure chamber;
   a piezoelectric element disposed on the film and including a piezoelectric part, a first electrode, and a second electrode, wherein the first electrode is disposed on a first side of the piezoelectric part facing the pressure chamber, and the second electrode is disposed on a second side of the piezoelectric part opposite the first side;
   a gold trace connected to the first electrode or the second electrode;

a first metal part made of a metal material except for gold and positioned between the film and the gold trace;
a plurality of other piezoelectric elements; and
a second metal part which is disposed on the film and laminated with the first electrode,
wherein the first metal part is laminated with the gold trace,
wherein the first electrode is a common electrode which is provided commonly for the piezoelectric element and the plurality of other piezoelectric elements,
wherein the second electrode is an individual electrode which is provided individually for the piezoelectric element,
wherein the first electrode is made of platinum,
wherein the second electrode is connected to the gold trace,
wherein the second metal part is made of the same metal material as the first metal part,
wherein the metal material is different from gold and platinum, and
wherein the first metal part is separated from the second metal part.

8. The liquid discharge apparatus according to claim 7, wherein the second metal part is positioned between the film and the first electrode.

9. The liquid discharge apparatus according to claim 7, wherein the first electrode has a first area which includes an area facing the second electrode with the piezoelectric part interposed therebetween, and
wherein, in the first area, no second metal part is provided or a thickness of the second metal part is thinner than a thickness of the second metal part in an area other than the first area.

10. The liquid discharge apparatus according to claim 9, wherein the piezoelectric part entirely covers the first area of the first electrode.

11. The liquid discharge apparatus according to claim 9, wherein an outer periphery of the first area in the first electrode is disposed outside of positions where a deformation curvature of the film is at a maximum.

12. The liquid discharge apparatus according to claim 9, wherein in a second area different from the first area, the piezoelectric part is disposed to overlap with the first electrode and the second metal part, and
a slit is formed in a part, of the piezoelectric part, disposed on the second area.

13. The liquid discharge apparatus according to claim 7, wherein the second metal part is thinner than the first metal part.

14. The liquid discharge apparatus according to claim 7, wherein the first metal part and the second metal part are made of zirconium, tantalum, or tungsten.

15. A liquid discharge apparatus, comprising:
a pressure chamber;
a film covering the pressure chamber;
a piezoelectric element disposed on the film and including a piezoelectric part, a first electrode, and a second electrode, wherein the first electrode is disposed on a first side of the piezoelectric part facing the pressure chamber, and the second electrode is disposed on a second side of the piezoelectric part opposite the first side;
a gold trace connected to the first electrode or the second electrode;
a first metal part made of a metal material except for gold and positioned between the film and the gold trace; and
a plurality of other piezoelectric elements,
wherein the first metal part is laminated with the gold trace,
wherein the first electrode is a common electrode which is provided commonly for the piezoelectric element and the plurality of other piezoelectric elements,
wherein the second electrode is an individual electrode which is provided individually for the piezoelectric element,
wherein the first electrode is made of platinum,
wherein the second electrode is connected to the gold trace, and
wherein the first electrode has a thickness of 0.1 µm or less.

16. A liquid discharge apparatus, comprising:
a pressure chamber;
a film covering the pressure chamber;
a piezoelectric element disposed on the film and including a piezoelectric part, a first electrode, and a second electrode, wherein the first electrode is disposed on a first side of the piezoelectric part facing the pressure chamber, and the second electrode is disposed on a second side of the piezoelectric part opposite the first side;
a gold trace directly connected to the first electrode or the second electrode; and
a first metal part made of a metal material except for gold and positioned between the film and the gold trace,
wherein the first metal part is laminated with the gold trace.

* * * * *